(12) United States Patent
Shim et al.

(10) Patent No.: US 8,421,202 B2
(45) Date of Patent: Apr. 16, 2013

(54) INTEGRATED CIRCUIT PACKAGING SYSTEM WITH FLEX TAPE AND METHOD OF MANUFACTURE THEREOF

(75) Inventors: Il Kwon Shim, Singapore (SG); Seng Guan Chow, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 307 days.

(21) Appl. No.: 12/717,085

(22) Filed: Mar. 3, 2010

(65) Prior Publication Data

US 2010/0224978 A1    Sep. 9, 2010

Related U.S. Application Data

(60) Provisional application No. 61/157,931, filed on Mar. 6, 2009.

(51) Int. Cl.
*H01L 23/02*    (2006.01)
(52) U.S. Cl.
USPC .................................. 257/686; 257/E25.013

(58) Field of Classification Search .............. 257/686, 257/777, E25.013, E25.018, E23.021, E23.027
See application file for complete search history.

(56) References Cited

U.S. PATENT DOCUMENTS

| | | | |
|---|---|---|---|
| 7,309,913 B2 * | 12/2007 | Shim et al. ............. | 257/686 |
| 7,397,129 B2 | 7/2008 | Lee | |
| 7,611,923 B2 * | 11/2009 | Fasano et al. ............ | 438/106 |
| 2004/0207049 A1 * | 10/2004 | Bauer et al. ............. | 257/620 |

OTHER PUBLICATIONS

Definition of "conformal", "Merriam-Webster's Collegiate Dictionary", 2009, pp. 261-262, Eleventh Edition, Publisher: Merriam-Webster, Incorporated, Published in: Springfield, MA, USA.

\* cited by examiner

*Primary Examiner* — Jenny L Wagner
(74) *Attorney, Agent, or Firm* — Ishimaru & Associates LLP

(57) ABSTRACT

A method of manufacture of an integrated circuit packaging system includes: providing a substrate; attaching a device to the substrate; providing interconnects on the substrate; and forming a flexible tape substantially conformal to the device and contacting the interconnects.

20 Claims, 3 Drawing Sheets

INTEGRATED CIRCUIT PACKAGING SYSTEM WITH FLEX TAPE AND METHOD OF MANUFACTURE THEREOF

CROSS-REFERENCE TO RELATED APPLICATION(S)

This application claims the benefit of U.S. Provisional Patent Application Ser. No. 61/157,931 filed Mar. 6, 2009, and the subject matter thereof is incorporated herein by reference thereto.

TECHNICAL FIELD

The present invention relates generally to an integrated circuit packaging system, and more particularly to a system for packages employing flexible tape.

BACKGROUND ART

The goals for the entire integrated circuit (IC) packaging industry include faster, more reliable, and higher-density circuits, produced at lower cost to produce smaller devices for cellphones, video cameras, portable music players, etc. The goals of packaging IC for the future will be met by reducing the number of internal interconnections and increasing the density of chips.

Various techniques, such as, flip chip, ball grid array (BGA), chip on board (COB), and multi-chip modules (MCM), have been developed to meet the continued demands for improving system performance and hardware capabilities, while the space in which to provide these improved hardware capabilities continues to decrease.

Multiple integrated circuit devices may be fabricated within a single package, thereby forming a MCM. A single MCM may include two or more discrete integrated circuit devices, which may be arranged one on top of one another over a substrate (i.e.—vertically stacked). This mounting technique permits a higher density of chips or integrated circuits on the MCM substrate. The substrate may include one or more layers of electrically conductive material separated by dielectric materials.

Although vertically stacked MCM's may increase the effective density of chips, over that of horizontally placed MCM components, it has the disadvantage in that the MCM's must usually be assembled before the component chips and chip connections can be tested. These extra manufacturing steps can lead to increased cost and decreased product yield if the chips are defective.

Another common problem associated with vertically stacked MCM's is that the bottom chip must be larger than the top chip to accommodate the plurality of bond pads located on the bottom chip. Due to the constraint of limited space available for mounting individual chips on a substrate, the larger configuration of the bottom chip decreases the number of chips per semiconductor wafer, and correspondingly, increases the cost of manufacturing.

Another manufacturing technique is vertically stacked packaging (i.e., a package on package configuration). However, this manufacturing process has its own problems, such as, local and global planarization inconsistencies.

Additionally, the mold cap of a bottom package in a package on package structure must be kept thin; otherwise, the ball diameters of the solder balls formed on the top substrate must be excessively large in order to contact the bottom package. However, thin mold caps can cause their own problems during package on package assembly, such as, restricted selection of epoxy mold compounds.

In other packaging, the top package normally has at least the package size to clear the bottom mold cap dimensions with large solder balls arranged in the peripheral area. This results in an unnecessarily large package size to match the bottom package footprint.

Furthermore, package structures are prone to mechanical damage during test handling which further slows the testing process and system throughput.

Thus, despite recent developments in semiconductor packaging techniques, a need still remains for improved packaging device structures and methods of fabrication for increasing semiconductor chip densities while protecting package structures during test handling. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; attaching a device to the substrate; providing interconnects on the substrate; and forming a flexible tape substantially conformal to the device and contacting the interconnects.

The present invention provides an integrated circuit packaging system, including: a substrate; a device over the substrate; an interconnect on the substrate; and a flexible tape having a shape substantially conformal to the device and contacting the interconnects.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
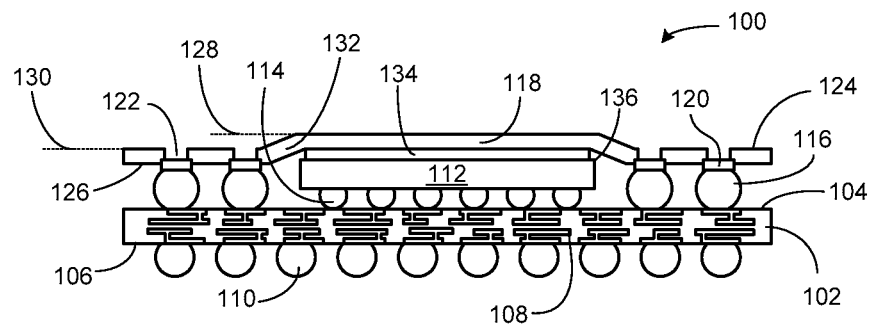
FIG. 1 is a cross-sectional view of an integrated circuit packaging system in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "processing" as used herein includes deposition of material or photoresist, patterning, exposure, development, etching, cleaning, and/or removal of the material or photoresist as required in forming a described structure.

The term "on" is defined as meaning there is direct contact between elements or components.

The terms "example" or "exemplary" are used herein to mean serving as an instance or illustration. Any aspect or embodiment described herein as an "example" or as "exemplary" is not necessarily to be construed as preferred or advantageous over other aspects or designs.

FIGS. 1-6, which follow, depict by way of example and not by limitation, exemplary embodiments for the formation of an integrated circuit packaging system and they are not to be construed as limiting. It is to be understood that a plurality of conventional processes that are well known within the art and not repeated herein, may precede or follow FIGS. 1-6. Moreover, it is to be understood that many modifications, additions, and/or omissions may be made to the below described processes and/or embodiments without departing from the scope of the claimed subject matter. For example, the below described processes and/or embodiments may include more, fewer, or other steps. Additionally, steps may be performed in any suitable order without departing from the scope of the present invention.

Moreover, it is to be appreciated that the integrated circuit packaging system of the present disclosure may include any number of stacked devices and/or packages, such as but not limited to, memory circuits, logic circuits, analog circuits, digital circuits, passive circuits, RF circuits, or a combination thereof, for example. Moreover, it is to be understood that the integrated circuit packaging system manufactured by the embodiments described herein can be used within processor components, memory components, logic components, digital components, analog components, mixed-signal components, power components, radio-frequency (RF) components, digital signal processor components, micro-electromechanical components, optical sensor components, or a combination thereof, in numerous configurations and arrangements as may be needed.

Furthermore, it is to be understood that one or more of the integrated circuit packaging system could be prepared at one time on a medium, which could be separated into individual or multiple integrated circuit package assemblies at a later stage of fabrication.

Referring now to FIG. 1, therein is shown a cross-sectional view of an integrated circuit packaging system 100 in accordance with an embodiment of the present invention. In at least one embodiment, the integrated circuit packaging system 100 can be referred to as a bottom package-on-package (PoPb) structure.

Generally, the integrated circuit packaging system 100 may include a substrate 102, a first side 104, a second side 106, a conductor 108, an external terminal 110, a device 112, a solder bump 114, an interconnect 116, a flexible tape 118, a conductor pad 120, a conductor opening 122, a first side 124, a second side 126, a first plane 128, a second plane 130, a transition region 132, and an adhesive 134.

Generally, the substrate 102 may include a carrier substrate, a semiconductor substrate, an interposer, or a multilayer structure (e.g., a laminate with one or more conductive layers separated by an insulator) suitable for electrically interconnecting integrated circuit systems, such as the device 112, formed on or above the substrate 102 to external electrical circuits.

However, it is to be understood that the substrate 102 is not limited to these examples. In accordance with the invention, the substrate 102 may include any electrical interconnection structure that facilitates the incorporation of the integrated circuit packaging system 100 into a higher-level assembly, such as a printed circuit board or other suitable structure for supporting and/or electrically interfacing with the integrated circuit packaging system 100.

Generally, the substrate 102 may include the first side 104 (e.g., a top surface) within a different plane and opposing the second side 106 (e.g., a bottom surface). Conductive pathways, which may include a combination of traces, vias, and/or redistribution layers, provide an electrical connection between the first side 104 and the second side 106 of the substrate 102. The conductive pathways terminating at the first side 104 electrically connect to the conductors 108 formed in a pre-selected pattern to correspond with the electrical connection configuration of the device 112 and/or the flexible tape 118. By way of example, the conductors 108 on the first side may include a land grid array (LGA) configuration or a ball grid array (BGA) configuration.

The conductive pathways terminating at the second side 106 (e.g., at the conductors 108) may provide further electrical connections to external electrical circuits via bottom conductors, such as the external terminals 110. It will be appreciated by those skilled in the art that the external terminals 110 may include solder balls formed as part of a ball grid array structure. Although the present embodiment depicts the external terminal 110 as a solder ball, it is to be understood that the external terminal 110 may include any interface connection technology, such as a pin or land grid array that establishes electrical contact between the integrated circuit packaging system 100 and external electrical circuits.

Generally, the substrate 102 can be formed larger than the device 112 to accommodate the formation of the flexible tape 118 there over.

In at least one embodiment, the substrate 102 may include an interposer. The term interposer is defined to mean an electrical interface without active or passive devices that routes electrical signals between one connection to another connection. By way of example, the interposer may be used to distribute an electrical connection between electrical contacts possessing different densities and/or to reroute an electrical connection to a different electrical connection. In general, the interposer may be a multi-layer substrate containing conductive traces for connecting the external terminal 110 to the interconnect 116 as well as the external terminals 110 and the interconnects 116 among themselves.

Formed over and/or directly on the substrate 102 is the device 112. The device 112 can be attached to the substrate 102 by techniques well known within the art and not described herein. In at least one embodiment, the device 112 can be mounted over or on the first side 104 of the substrate 102 adjacent and inward of the interconnects 116.

Generally, the device 112 may include one or more active devices, passive devices, or a combination thereof, vertically stacked or located within the same plane. By way of example, and not by way of limitation, the device 112 may include one or more semiconductor chips or die that transmit, receive, modulate and/or alter electrical signals, such as stacked devices, modular devices, ASIC devices, memory devices, RF devices, analog devices or a combination thereof. In other embodiments, the device 112 may further include, by way of example and not by way of limitation, one or more integrated circuit packages that transmit, receive, modulate and/or alter electrical signals, such as leaded and non-leaded packages, internal stacking module packages, flip-chip packages, modular packages, application-specific-integrated-circuit (ASIC) packages, RF packages, analog packages, memory packages, stacked die packages or a combination thereof. Additionally, the device 112 may also include a pre-molded configuration.

In at least one embodiment, the device 112 includes a flip-chip die electrically attached to the substrate 102 by the solder bump 114, which can also be a solder paste or ball, for example. Accordingly, the embodiment embraces electrically connecting the device 112 to the substrate 102 by all known ball grid array and land grid array contact techniques.

Furthermore, it is to be understood that the device 112 may also include Package-in-Package (PiP) and Package-on-Package (PoP) configurations. The PiP system is a three-dimensional (3D) package system that stacks a fully tested Internal Stacking Module (ISM) on top of a Base Assembly Package (BAP) to form a single Chip Scale Package (CSP). PoP is a 3D package in which fully tested packages are stacked on top of another single or stacked package during the board mount process.

As such, it is to be understood that the device 112 covers a wide range of semiconductor chip and integrated circuit package configurations involving various sizes, dimensions, and functional applications, and the type of chip or package configuration employed should only be limited by the design specifications of the integrated circuit packaging system 100.

Moreover, it will be appreciated by those skilled in the art that the present embodiments permit the testing of the device 112 before adhering it to the substrate 102, thereby ensuring the use of known good die or packages in the manufacturing process. Additionally, after completing the integrated circuit packaging system 100, this assembly can also be tested before incorporation into additional package systems. This ensures that the final product includes known good assemblies, thereby improving the manufacturing process yield for the integrated circuit packaging system 100.

Generally, the flexible tape 118 is electrically connected to the first side 104 of the substrate 102 by top conductors, such as the interconnect 116. The conductor pads 120 of the flexible tape 118 can be in contact with the interconnect 116 and the conductor opening 122 can be positioned over the interconnect 116 so they may be electrically connected to other package systems through the conductor opening 122. In at least one embodiment, the interconnect 116 may include solder balls. It will be appreciated by those skilled in the art that the interconnects 116 can be formed on either the substrate 102 or the flexible tape 118 and then attached to the other.

It has been discovered by the present inventors that the vertical height of the interconnect 116 can be reduced, thereby improving reliability and durability of the interconnect 116 during testing, because the flexible tape 118 conformally deposits around the device 112 in a configuration that reduces the distance between the substrate 102 and the flexible tape 118 as compared to a rigid planar structure. In at least one embodiment, by conformally depositing the flexible tape 118 around the device 112, the flexible tape 118 can be bent along or over an edge 136 of the device 112. The flexible tape 118 can be described as substantially conforming to the shape of the device 112 by partially reproducing the shape of the device 112, thereby leaving the size of an angle between some corresponding shapes or curves substantially unchanged. The terms "substantially conforming" and "substantially conformal" as used herein are defined to mean that the flexible tape 118 is not flat or parallel over the entire length and width thereof.

Moreover, it has been discovered by the present inventors that a finer pitch, and correspondingly higher density, for the interconnect 116 can be achieved because the diameter for each of the interconnect 116 has been reduced by forming the flexible tape 118 closer to the substrate 102 than a rigid planar structure can achieve.

In at least one embodiment, the conductor openings 122 can be closed off by the conductor pads 120, wherein the conductor pads 120 provide an electrical connection with the interconnect 116 so as to allow pre-testing of the integrated circuit packaging system 100 before assembly into a stacked package system.

Generally, the flexible tape 118 may include the first side 124 (e.g., a top side) within a different plane and opposing and the second side 126 (e.g., a bottom side). Conductive pathways within the flexible tape 118 may include a combination of traces, vias, and/or redistribution layers that can provide an electrical connection between the first side 124 and the second side 126, as well as between each of the conductor pads 120.

In general, the flexible tape 118 can be described as possessing the second plane 130 below (i.e., closer to the substrate 102) the first plane 128. Stated another way, if the second plane 130 is a distance "X" from the substrate 102, then the first plane 128 is a distance "X+Y" from the substrate 102, wherein "X" and "Y" are both positive values greater than zero. For purposes of reference, the first plane 128 and the second plane 130 are determined with respect to the first side 124 of the flexible tape 118.

Accordingly, in at least one embodiment, the flexible tape 118 can be described as possessing a step shaped configuration wherein the second plane 130 is below the first plane 128. The first plane 128 and the second plane 130 can be interconnected and/or joined together by the transition region 132 that includes the material of the flexible tape 118.

The adhesive 134 can be formed between the flexible tape 118 and the device 112. Generally, the adhesive 134 may include any material that provides a secure bond between the flexible tape 118 and the device 112. For purposes of this disclosure, a secure bond is one that does not separate during normal package handling and/or testing. By way of example, the adhesive 134 may include a double sided adhesive tape, contact adhesives, thermosetting adhesives, or thermally conductive adhesives. In at least one embodiment, the adhesive 134 securely bonds a non-active side of the device 112 to the second side 126 (e.g., the bottom side) of the flexible tape 118.

Figure 2:
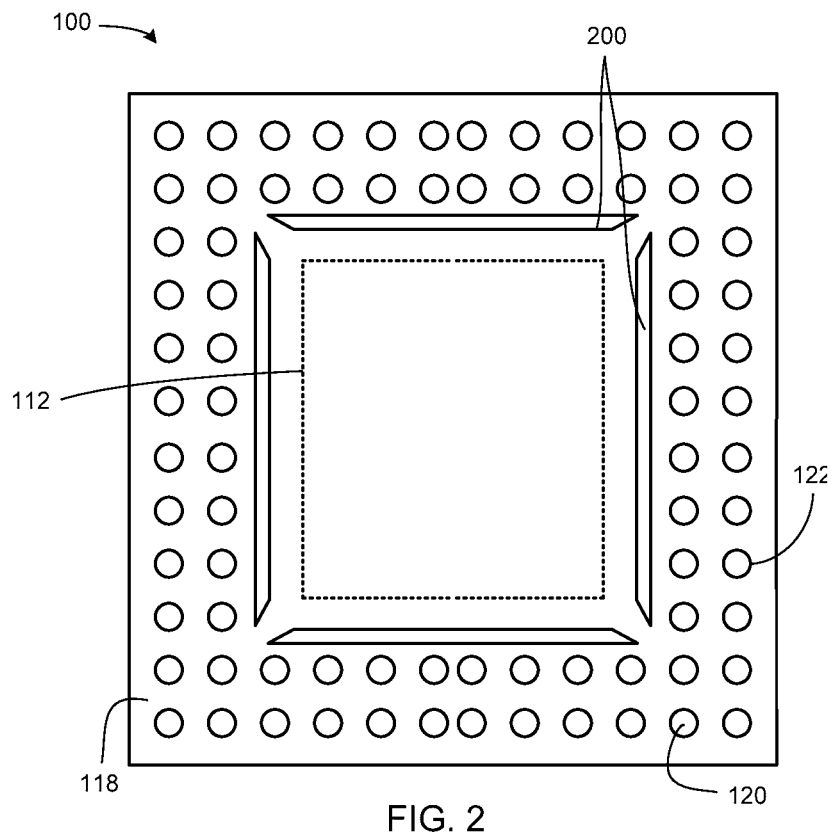
FIG. 2 is a plan view of the integrated circuit packaging system in accordance with an embodiment of the present invention.

Referring now to FIG. 2, therein is shown a plan view of the integrated circuit packaging system 100 of FIG. 1 in accordance with an embodiment of the present invention.

Generally, the integrated circuit packaging system 100 includes the flexible tape 118, such as flexible circuitry tape, formed over a bottom device or package, such as a bottom package-on-package. The flexible tape 118 may include the conductor pad 120, the conductor opening 122, and a slit 200.

In at least one embodiment, the flexible tape 118 can be mounted over the device 112 (depicted by a dashed outline), such as a die, and may include materials sufficiently flexible to substantially conform to a portion of the device so that the flexible tape 118 is not flat or parallel over the entire length and width thereof. For purposes of illustration, the portion of the flexible tape 118 formed directly over the device 112 can be located above a plane of the flexible tape 118 located outward of the device and directly adjacent to the substrate 102, of FIG. 1.

It will be appreciated by those skilled in the art that the suppleness or flexibility of the flexible tape 118 permits improved electrical interconnection to uneven underlying surfaces. It has been discovered that the flexible tape 118 permits pre-testing of package structures via the conductor pad 120 of the flexible tape 118, thereby preventing damage to the package structures from unintended mechanical stresses encountered during testing.

In another embodiment, the flexible tape 118 may not only be sufficiently flexible to substantially conform but may also be sufficiently stiff to further protect the device 112 from mechanical damage during test handling. It has been discovered that by controlling and adjusting the level of stiffness within the flexible tape 118 that underlying structures and/or surfaces can be further protected form mechanical damage during test handling.

It will be understood by those skilled in the art that if the stiffness of the flexible tape 118 is increased to better protect the device 112 that one or more of the slit 200 may be optionally placed in the flexible tape 118 to allow the flexible tape 118 to be more easily shaped around the device 112. By way of example, the slit 200 may be formed by removing (e.g., by etching, drilling, punching or laser ablation) the material of the flexible tape 118 to form an aperture.

In at least one embodiment, the slit 200 can be placed peripherally adjacent the device 112 on one or more sides of the device 112. In such cases, each of the slit 200 can be formed between the conductor openings 122 and the portion of the flexible tape 118 located over the device 112. In at least one embodiment, the slit 200 may include a trapezoidal shape. It will be understood by those skilled in the art that the size, number, shape, and location of the slit 200 are only to be limited by the design specifications and/or the desired flexibility of the flexible tape 118.

Generally, the conductor opening 122 can be formed by removing a portion of the top and/or bottom of the flexible tape 118 to expose the conductor pads 120. However, it is to be understood that the formation of the conductor opening 122 is not essential, what is important is that the conductor pad 120 exist, thereby providing an exposed electrical interconnection through the flexible tape 118. In at least one embodiment, the conductor openings 122 can be provided in the flexible tape 118 around or peripherally adjacent the portion of the flexible tape 118 located over the device 112. In another embodiment, the conductor openings 122 can be located between a perimeter of the flexible tape 118 and the slit 200 formed peripherally adjacent the portion of the flexible tape 118 located over the device 112. In yet another embodiment, the conductor opening 122 can be formed in the second plane 130, of FIG. 1, of the flexible tape 118.

In general, the spacing of the conductor openings 122 is currently only to be limited by the technology of solder ball equipment and the minimum required operating space. By way of example, the conductor openings 122 can have center-to-center distances sufficiently close to have a fine pitch in the order of 0.4 mm.

Figure 3:
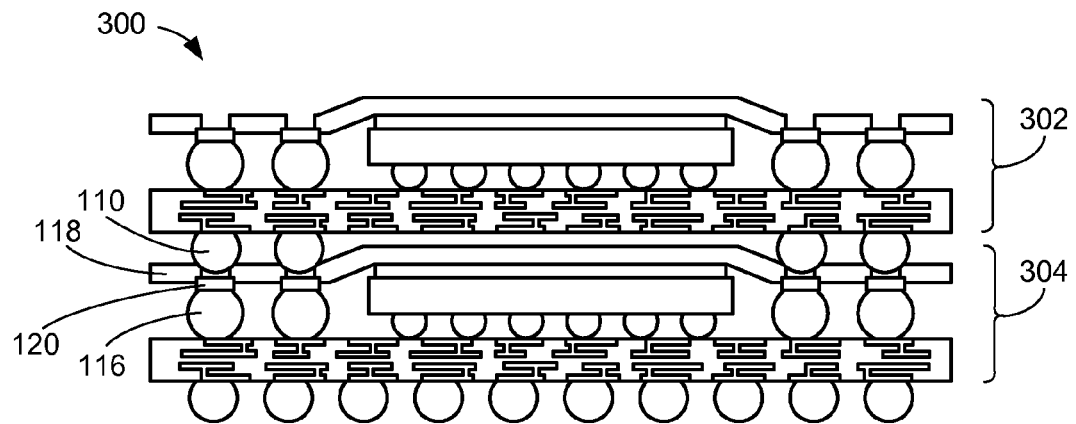
FIG. 3 is a cross-sectional view of the integrated circuit packaging system in a stacked integrated circuit packaging system in accordance with an alternate embodiment of the present invention.

It has been discovered that the present embodiments permit a fine pitch (i.e., a pitch defined relative to the current technology node) external interconnect array for a top package 302, of FIG. 3, because the substantially conformal nature of the flexible tape 118 permits the portion of the flexible tape 118 formed directly over the substrate 102 to be in a second plane 130, of FIG. 1, that is closer to the substrate 102 than the first plane 128, of FIG. 1, of the flexible tape 118.

It will be understood by those skilled in the art that the size, number, shape, and location of the conductor openings 122 are only to be limited by the design specifications and/or the desired input/output capability of the flexible tape 118. The conductor openings 122 may also include tapered sidewalls.

The flexible tape 118 may have the conductor pads 120 covering and/or within the conductor openings 122. It is to be understood that the conductor pads 120 can provide an electrical interface or electrical interconnection. Generally, the conductor pad 120 may include any type of material that provides a low resistance electrical interface between electrical connections.

It will be appreciated by those skilled in the art that the conductor pads 120 may also represent conductive paths that may be placed on the flexible tape 118 for routing electrical connections between different ones of the conductor pads 120.

It will also be appreciated by those skilled in the art that the flexible tape 118 can be formed from insulating and/or thermally conducting type materials and may include any thickness that is only limited by the functionality (e.g., durability, package profile limitations, flexibility, and/or mechanical damage prevention) of the flexible tape 118.

Referring now to FIG. 3, therein is shown a cross-sectional view of the integrated circuit packaging system 100 of FIG. 1 in a stacked integrated circuit packaging system 300 in accordance with an alternate embodiment of the present invention.

In at least one embodiment, the integrated circuit packaging system 300 includes the top package system 302, such as a second package system, stacked over a bottom package system 304, such as a first package system like the integrated circuit package system 100, with the external terminals 110

(e.g., bottom conductors) of the top package system 302 directly on the conductor pads 120 of the bottom package system 304.

It will be appreciated by those skilled in the art that the external terminals 110 (e.g., bottom conductors) of the top package system 302 may also be stacked directly on the interconnect 116 of the bottom package system 304 (i.e., the conductor pads 120 of the flexible tape 118 can be removed from between the external terminals 110 and the interconnects 116).

Furthermore, although the present embodiment only depicts the top package system 302 stacked over the bottom package system 304, it will be appreciated by those skilled in the art that the stacked integrated circuit packaging system 300 may include three or more stacked package systems as well, which may include more than one of the integrated circuit packaging system 100.

Figure 4:
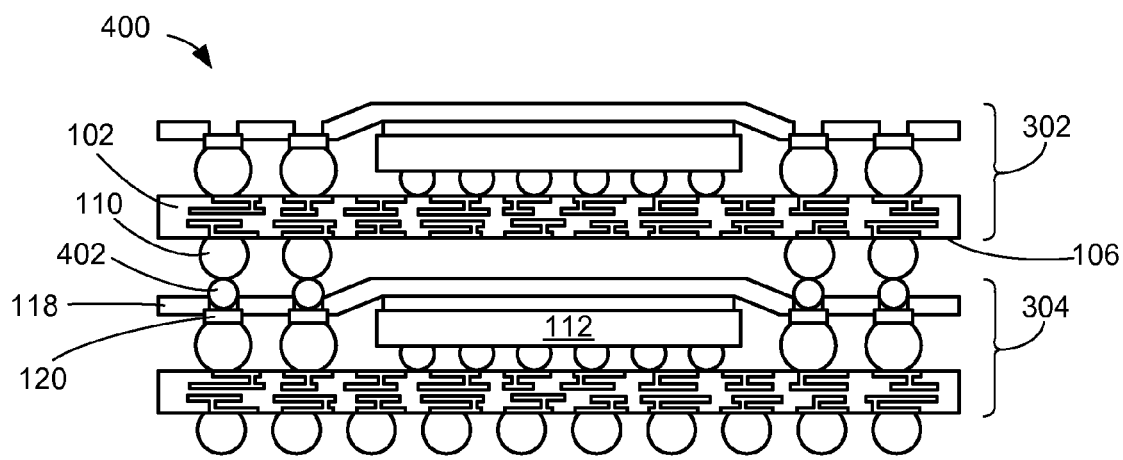
FIG. 4 is a cross-sectional view of the integrated circuit packaging system in a stacked integrated circuit packaging system in accordance with a further alternate embodiment of the present invention.

Referring now to FIG. 4, therein is shown a cross-sectional view of the integrated circuit packaging system 100 of FIG. 1 in a stacked integrated circuit packaging system 400 in accordance with a further alternate embodiment of the present invention.

The stacked integrated circuit packaging system 400 includes the top package system 302 stacked over or on top of the bottom package system 304 with the external terminals 110 (e.g., bottom conductors) of the top package system 302 on an intermediate conductor 402, such as intermediate solder balls, paste, or bumps, formed on the conductor pads 120 of the flexible tape 118 of the bottom package system 304.

Per this embodiment, the second side 106 of the substrate 102 of the top package system 302 may further include the external terminals 110 formed over the device 112 of the bottom package system 304 for purposes of electrical interconnection and/or for purposes of mechanical support. In such cases, the flexible tape 118 of the bottom package system 304 may also include the conductor pads 120 in the portion of the flexible tape 118 formed over the device 112 of the bottom package system 304. It will be appreciated by those skilled in the art that such a configuration can provide additional electrical interconnection sites for the top package system 302.

Furthermore, although the present embodiment only depicts the top package system 302 stacked over the bottom package system 304, it will be appreciated by those skilled in the art that the stacked integrated circuit packaging system 400 may include three or more stacked package systems as well, which may include more than one of the integrated circuit packaging system 100.

Figure 5:
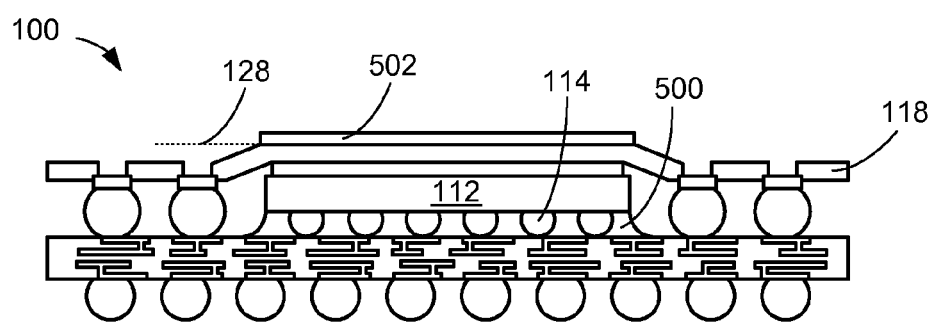
FIG. 5 is a cross-sectional view of the integrated circuit packaging system in accordance with a further embodiment of the present invention.

Referring now to FIG. 5, therein is shown a cross-sectional view of the integrated circuit packaging system 100 of FIG. 1 in accordance with a further embodiment of the present invention.

The integrated circuit packaging system 100 of the present embodiment is similar to the integrated circuit packaging system 100, of FIG. 1. However, the present embodiment differs from the embodiment of FIG. 1 by additionally forming an underfill 500 and a stiffener 502.

Generally, the underfill 500 may include any material that helps to protect the solder bumps 114. As is known in the art, the underfill 500 may also enhance the rigidity of the structure, prevent cracks within the solder bumps 114, and/or improve thermal dissipation. The underfill 500 can formed around some or all of the solder bumps 114 of the device 112. It will be appreciated by those skilled in the art that the material of the underfill 500 and the application techniques using it are well known in the art and not repeated herein. However, in at least one embodiment, the underfill 500 may include a zero-fillet formation, wherein the underfill 500 does not extend beyond the perimeter of the device 112.

The stiffener 502 can be provided over or on a raised portion (e.g., the first plane 128) of the flexible tape 118 to provide additional rigidity or stiffness to protect the device 112 from mechanical damage during handling and/or testing. In at least one embodiment, the stiffener 502 may include a thermally conductive material to enhance thermal dissipation of energy from the integrated circuit packaging system 100.

Figure 6:
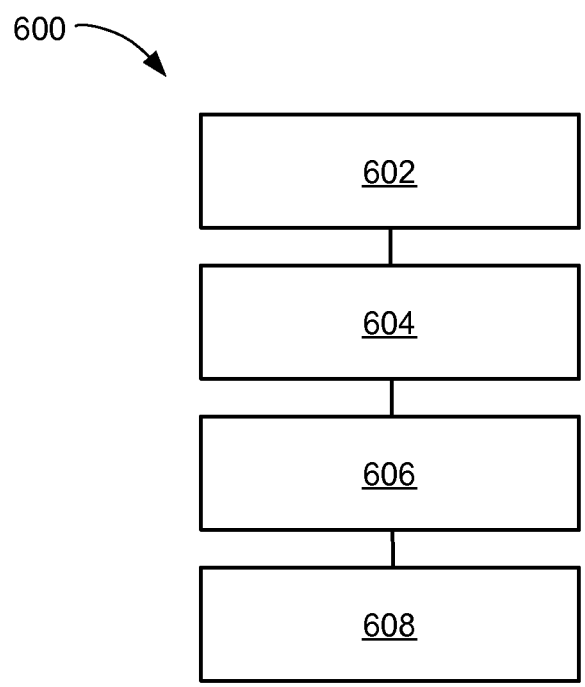
FIG. 6 is a flow chart of a method of manufacture of the integrated circuit packaging system in a further embodiment of the present invention.

Referring now to FIG. 6, therein is shown a flow chart of a method 600 of manufacture of an integrated circuit packaging system 100 in a further embodiment of the present invention. The method 600 includes: providing a substrate in a block 602; attaching a device to the substrate in a block 604; providing interconnects on the substrate in a block 606; and forming a flexible tape substantially conformal to the device and contacting the interconnects in a block 608.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

It has been discovered that the present invention thus has numerous aspects. One such aspect is that the present invention can protect the device (e.g., a flip-chip device) of a package system form mechanical damage during handling and testing by utilizing a material for the flexible tape that is sufficiently stiff to prevent damage. Additionally, mechanical damage of the device can be further reduced by employing an optional stiffener over the flexible tape. It will also be appreciated by those skilled in the art that the optional stiffener can increase the rigidity of the flexible tape and prevent warping of the integrated circuit packaging system.

Another aspect is that the present invention permits pretesting of a package system via the conductive pads of the flexible tape, thereby further minimizing any potential mechanical damage to the package system caused by testing and handling. Additionally, testability of the package system can be improved because the conductive pads of the flexible tape are manufactured in a uniform and well defined pattern.

Another aspect is that the present invention permits a fine pitch (i.e., a pitch defined relative to the current technology node) external interconnect array for a top package because the substantially conformal nature of the flexible tape permits the portion of the flexible tape formed directly over the substrate to be in a second plane that is closer to the substrate than the first plane of the flexible tape.

Yet another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;

attaching a device to the substrate;
providing an interconnect on the substrate; and
applying a flexible tape over the device and contacting the interconnect, the flexible tape bent over an edge of the device.

2. The method as claimed in claim 1 wherein:
providing the substrate includes providing an interposer.

3. The method as claimed in claim 1 wherein:
applying the flexible tape includes the flexible tape having a slot adjacent and parallel to a side of the device.

4. The method as claimed in claim 1 further comprising:
providing an underfill between the device and the substrate.

5. The method as claimed in claim 1 wherein:
attaching the device to the substrate includes attaching one or more active devices, passive devices, or a combination thereof.

6. A method of manufacture of an integrated circuit packaging system comprising:
providing a substrate including a first side opposing a second side;
attaching a device to the first side of the substrate;
providing an interconnect on the first side of the substrate and an external terminal on the second side; and
applying a flexible tape in a step shaped configuration over the device and contacting the interconnect, the flexible tape bent over an edge of the device.

7. The method as claimed in claim 6 wherein:
applying the flexible tape includes configuring the flexible tape to include a first side with a first plane and a second plane.

8. The method as claimed in claim 6 further comprising:
providing a stiffener formed over the flexible tape.

9. The method as claimed in claim 6 further comprising:
providing a second package over and electrically contacting the flexible tape.

10. The method as claimed in claim 6 further comprising:
providing a second package over and electrically contacting the flexible tape through intermediate conductors.

11. An integrated circuit packaging system comprising:
a substrate;
a device over the substrate;
an interconnect on the substrate; and
a flexible tape over the device and contacting the interconnect, the flexible tape bent over an edge of the device.

12. The system as claimed in claim 11 wherein:
the substrate includes an interposer.

13. The system as claimed in claim 11 wherein:
the flexible tape includes the flexible tape having a slot adjacent and parallel to a side of the device.

14. The system as claimed in claim 11 further comprising:
an underfill between the device and the substrate.

15. The system as claimed in claim 11 further comprising:
an adhesive between the device and the flexible tape.

16. The system as claimed in claim 11 further comprising:
the substrate including a first side opposing a second side;
the device over the first side of the substrate;
the interconnect connected on the first side of the substrate and an external terminal connected on the second side; and
the flexible tape configured in a step shape.

17. The system as claimed in claim 16 wherein:
the flexible tape further includes a first side with a first plane and a second plane.

18. The system as claimed in claim 16 further comprising:
a stiffener over the flexible tape.

19. The system as claimed in claim 16 further comprising:
a second package over and electrically contacting the flexible tape.

20. The system as claimed in claim 16 further comprising:
a second package over and electrically contacting the flexible tape through intermediate conductors.

* * * * *